United States Patent [19]

Allyn et al.

[11] Patent Number: 4,498,093
[45] Date of Patent: Feb. 5, 1985

[54] HIGH-POWER III-V SEMICONDUCTOR DEVICE

[75] Inventors: Christopher L. Allyn, Morristown; Peter G. Flahive, New Providence; David E. Iglesias; Wolfgang O. W. Schlosser, both of Basking Ridge; Stuart H. Wemple, Chatham Township, Morris County, all of N.J.

[73] Assignee: AT&T Bell Laboratories, Murray Hill, N.J.

[21] Appl. No.: 302,030

[22] Filed: Sep. 14, 1981

[51] Int. Cl.³ .......................................... H01L 29/80
[52] U.S. Cl. ........................................ 357/22; 357/15
[58] Field of Search ....................... 357/22, 15, 23 R

[56] References Cited

U.S. PATENT DOCUMENTS 3,986,196 10/1976 Decker ................................. 357/22
4,112,455  9/1978 Seliger et al. ...................... 357/22 X
4,196,439  4/1980 Mehaus et al. ........................ 357/22

OTHER PUBLICATIONS

S. M. Sze, "Physics of Semiconductor Devices", Wiley-Interscience, p. 411, 1969.
Fukuta, et al., "Power GaAs MESFET with a High Drain-Source Breakdown Voltage", IEEE Trans. on Micro Wave Theory and Techniques, vol. MTT-24, No. 6, pp. 312-317, Jun. 1976.
Frensley et al., "Effect of Gate Stripe Width on the Gain of GaAs MESFETS", Proceeding, 7th Biennial Cornell Electrical Engineering Conf., 1979, pp. 445-452.
Higashisaka et al., "A High Power GaAs MESFET with Experimentally Optimized Pattern", IEEE Trans. Electron Dev., vol. ED-27, No. 6, pp. 1025-1029, Jun. 1980.
A. G. Milnes, "Semiconductor Devices and Integrated Electronic"Van Nostrand Reinhold Co., pp. 349-350, (1980).
H. Statz, "Fabricating Field Effect Transistors", IBM Tech. Discl. Bull., vol. 11, No. 4, p. 397, Sep. 1968.

Primary Examiner—Martin H. Edlow
Attorney, Agent, or Firm—Peter A. Businger

[57] ABSTRACT

III-V semiconductor devices such as, e.g., MESFET, JFET, MOSFET, and IGFET devices are provided with relatively high-ohmic gates or wide gate finger widths as is desirable for maximum utilization of a semiconductor surface. For example, aluminum gate electrodes having a cross-sectional area of 1.2 square micrometer and a length of 300 micrometers or more are used. The resulting devices have unexpectedly high power handling capability.

7 Claims, 1 Drawing Figure

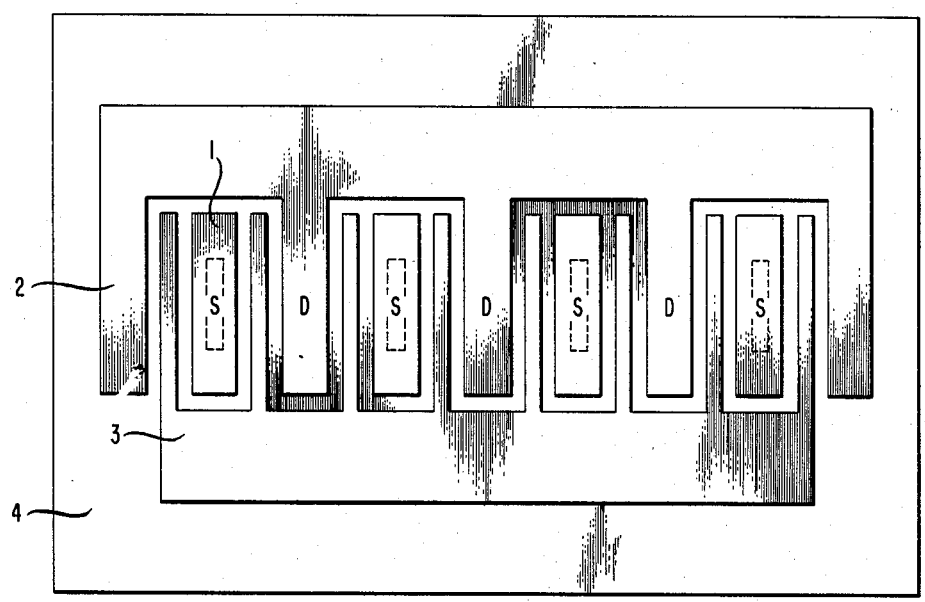

HIGH-POWER III-V SEMICONDUCTOR DEVICE

CROSS-REFERENCE TO RELATED APPLICATIONS

Concurrently filed by the same inventors is a patent application entitled "High-Gain III-V Semiconductor Device".

TECHNICAL FIELD

The invention is concerned with III-V semiconductor devices.

BACKGROUND OF THE INVENTION

Semiconductor devices are commercially well-established as active components in computing and communications equipment where they may serve, e.g., as gates and switches and as sources, modulators, and amplifiers of radio frequency radiation. Among semiconductor devices for radio frequency application are devices generally known as metal-semiconductor field effect transistors (MESFET) which are being used, e.g., as microwave amplifiers on account of their capability to operate at relatively high frequencies and power levels and their low noise output. The basic structure of MESFETs is well known in the art of semiconductor devices and is described, e.g., in the book by S. M. Sze, *Physics of Semiconductor Devices*, Wiley-Interscience, 1969. Specifically, on page 411 of the book by Sze, a basic device structure is shown to encompass a semi-insulating substrate on which an n-type semiconducting epitaxial layer is deposited. Three contacts are deposited on the semiconducting layer, namely, a first ohmic contact acting as a negative source contact, a Schottky barrier contact acting as a gate contact, and a second ohmic contact acting as a positive drain contact.

A more elaborate device structure is disclosed in U.S. Pat. No. 4,196,439, issued April 1, 1980 to W. C. Niehaus et al. There, a more heavily doped layer is situated between the active layer and the ohmic contacts and, moreover, the more heavily doped layer extends past an edge of the drain contact. The gate contact typically is placed in a notch in the active layer and, according to allowed U.S. Pat. No. 4,300,148, issued Nov. 10, 1981 to W. C. Niehaus et al., notch depth can be chosen so as to minimize a detrimental phenomenon known as gate-drain avalanche.

While it is possible to have electrical leads to contacts all on the free side of the active layer, an alternate, so-called source-via design provides for a source contact to be connected through the active layer and the substrate as disclosed in U.S. Pat. No. 3,986,196, issued Oct. 12, 1976 to D. R. Decker et al. The manufacture of devices based on this design is facilitated by a plasma-etching technique as disclosed by L. A. D'Asaro et al., "Plasma-Etched Via Connections to GaAs FET's, *Institute of Physics Conference Series*, No. 56, Chapter 5, pp. 267-273 (1981).

Source-via devices are considered to be particularly suitable for high-frequency applications where low source inductance is beneficial. A similar benefit may be realized by a so-called flip-chip design as considered, e.g., by Y. Mitsui et al., "10-GHz 10-W Internally Matched Flip-Chip GaAs Power FET's", *IEEE Transactions on Microwave Theory and Techniques*, Vol. MTT-29, No. 4, April 1981, pp. 304-309.

In the interest of optimum usage of a semiconductor chip, devices are being designed in which gate and drain contacts form comb-like patterns which are placed in an interdigitated fashion. Such devices are considered by A. Higashisaka et al., "A High-Power GaAs MESFET with an Experimentally Optimized Pattern", *IEEE Transactions on Electron Devices*, Vol. ED-27, No. 6, June 1980, pp. 1025-1029 and by W. R. Frensley et al., "Effect on Gate Stripe Width on the Gain of GaAs MESFETs", *Proceedings, Seventh Biennial Cornell Electrical Engineering Conference*, Cornell University, 1979, pp. 445-452.

SUMMARY OF THE INVENTION

A unipolar III-V semiconductor device such as, e.g., a MESFET (metal-semiconductor field effect transistor), MOSFET (metal-oxide-semiconductor field effect transistor), JFET (junction field effect transistor), or IGFET (insulated-gate field effect transistor) has a supported active layer which consists essentially of a doped III-V semiconductor material. In ohmic contact with the active layer are source means for providing free carriers to a first region of the active layer and drain means for removing free carriers from a second region of the active layer. A gate contact is on a third region of the active layer, designed for impressing an AC electrical signal on the third region so as to control AC current at the drain means.

In accordance with the invention, the device has a gate such that normalized gate resistance is greater than or equal to 0.75 ohm millimeter between a point of the gate corresponding to maximum AC current and a point of the gate corresponding to zero AC current. The resulting device is capable of handling an output power which is greater than or equal to 0.7–0.025f watts per millimeter, where f denotes frequency in gigahertz.

BRIEF DESCRIPTION OF THE DRAWING

The FIGURE shows, in greatly enlarged schematic plan view, a III-V semiconductor microwave amplification device.

DETAILED DESCRIPTION

The device shown in the FIGURE comprises source contact 1, drain contact 2, and gate contact 3, all on substrate-supported active layer 4. Source-via connections are shown by means of broken lines.

The active layer consists essentially of a III-V semiconductor material such as, e.g., gallium arsenide, indium phosphide, or indium gallium arsenide phosphide and has extrinsic properties due to net doping with an appropriate impurity. For example, the active layer may consist essentially of gallium arsenide doped with sulfur, selenium, tin, or silicon (resulting in an n-type device) or gallium-arsenide doped with beryllium or carbon (resulting in a p-type device).

Manufacture of the active layer may be by well-known methods of deposition on a substrate on which an optional buffer layer may have been deposited; among suitable methods are liquid phase epitaxy, vapor phase epitaxy, and molecular beam epitaxy. Active layer thickness is typically in the range of from 0.1 to 0.7 micrometer. In the case of small-size devices, low dopant concentrations are preferred as disclosed in the above-identified concurrently filed patent application.

As disclosed in the above-identified U.S. Pat. No. 4,196,439, a more heavily doped n+- or p+-layer may be deposited on the active layer so as to enhance source and drain contact quality. Surface features of the active layer such as, e.g., a notch for the gate contact are conveniently produced by etching. (Notch depth is preferably chosen as disclosed in the above-identified U.S. patent application Ser. No. 65,526). Similarly, etching may serve to produce a preferred ledge structure at the drain contact as disclosed in the above-identified U.S. Pat. No. 4,196,439.

Contact layers may be deposited by evaporation followed optionally by reinforcement by plating, and source-via contacts may be made as disclosed in the above-identified paper by L. A. D'Asaro et al. Among preferred ohmic contact materials are silver-gold-germanium and nickel-gold-germanium alloys.

Among preferred Schottky barrier contact materials are aluminum and three-layer structures of titanium, platinum, and gold. Gate contact height and length dimensions are typically on the order of 1 micrometer as measured in a cross-sectional plane which is perpendicular to the epitaxial layer and parallel to the direction of carrier movement. Gate cross section may typically be rectangular or have any desired shape.

Devices preferably are protected by means of a coating of a suitable dielectric material such as, e.g., silicon dioxide or silicon nitride as conveniently deposited by chemical vapor deposition or by sputtering.

In accordance with the invention, devices have high power handling capability and also high small-signal gate even when gate resistance is relatively high as, e.g., when gate finger width is large in the interest of maximum utilization of a semiconductor surface and in the interest of minimizing the number of gate fingers. Such resistance is measured between a first point of the gate where AC current is a maximum and a second point of the gate where AC current is zero. For example, when a device has a single gate finger, these points are the point of electrical connection and the free endpoint of the gate finger. Or, if electrical connection is made to several points of the gate, the first point is a point of connection and the second point may be a point which is intermediate to the first point and an adjacent point of connection. Any desired gate pattern may be used such as, e.g., straight-line or zig-zag.

Between first and second points as defined above, preferable normalized gate resistance is greater than or equal to 0.75 ohm millimeter and preferably greater than or equal to 1 ohm millimeter. If a device has several gate fingers (e.g., as shown in the FIGURE where the number of gate fingers is 8) there will be at least one gate finger for which this condition is satisfied. For example, in the case of an aluminum gate material and an essentially constant gate length of 1.5 micrometer and an essentially constant gate thickness of 0.8 micrometer, a normalized gate resistance of 0.75 ohm millimeter corresponds to a gate width of approximately 300 micrometers. Similarly, a normalized gate resistance of 1 ohm millimeter corresponds to a gate width of approximately 350 ohm millimeter.

More generally, gate width w of a gate made of an essentially homogeneous material and having essentially constant cross section is related to normalized gate resistance $R_g$ in accordance with the approximate formula $R_g = r_g w^2 / 3$, where $r_g$ is gate resistance in units such as, e.g., ohm per millimeter. Or, if gate cross section is denoted by A and if the gate contact material has a resistivity rho, then this same relationship is expressed by the formula $R_g = w^2 \rho / (3A)$. Accordingly, in the special case of an aluminum gate material having a resistivity of $3 \times 10^{-5}$ ohm millimeters, a normalized gate resistance $R_g$ greater than or equal to 0.75 ohm millimeters corresponds to an approximate gate finger width w greater than or equal to $274 A^{\frac{1}{2}}$, and a normalized gate resistance $R_g$ greater than or equal to 1 ohm millimeter corresponds to an approximate gate width w greater than or equal to $316 A^{\frac{1}{2}}$.

EXAMPLE 1

A gallium arsenide source-via MESFET was made having an aluminum gate. The device had a single gate finger whose cross-sectional area was approximately 1.2 micrometer square and whose gate finger width was approximately 500 micrometers (corresponding approximately to $R_g = 2.5$ ohm millimeters). At an operating frequency of approximately 12 gigahertz an output power of approximately 0.5 watts per millimeter total device gate width was realized.

EXAMPLE 2

A gallium arsenide source-via MESFET was made having an aluminum gate. The device had 8 gate fingers whose cross-sectional area was approximately 0.8 micrometers square and whose gate finger width was approximately 400 micrometers (corresponding approximately to $R_g = 2$ ohm millimeters). At an operating frequency of approximately 10 gigahertz an output power of approximately 0.63 watts per millimeter total device gate width was realized.

What is claimed is:

1. Unipolar semiconductor device for the amplification of an AC electrical signal having a frequency which is here specified in units of gigahertz, which is here designated as f, and which is less than or equal to 25 gigahertz, said device comprising
    a supported active layer which consists essentially of a doped III-V semiconductor material,
    source means for providing free carriers to a first region of said active layer,
    drain means for removing free carriers from a second region of said active layer,
    a gate contact on a third region of said active layer, said third region being intermediary to said first region and said second region and said gate contact being for impressing said AC signal on said third region so as to control AC current at said drain means,
    said device being characterized in that normalized gate resistance is greater than or equal to 0.75 ohm millimeter between a first point of said gate corresponding to maximum AC current and a second point of said gate corresponding to zero AC current, whereby said device is capable of having, at said drain means, a power output which is greater than or equal to 0.7–0.025f watts per millimeter of total device gate width.

2. Device of claim 1 in which said normalized gate resistance is greater than or equal to 1 ohm millimeter.

3. Device of claim 1 in which the material of said gate is aluminum, in which gate cross section is essentially constant and here designated by A, and in which the distance between said first point and said second point is greater than or equal to $274 A^{\frac{1}{2}}$.

4. Device of claim 3 in which said distance is greater than or equal to $316 A^{\frac{1}{2}}$.

5. Device of claim 1 in which said device has two or more gate fingers.

6. Device of claim 5 in which said gate fingers are essentially parallel.

7. Device of claim 1 in which said device is a metal-semiconductor field effect transistor having source-via connections.

* * * * *